(12) United States Patent
Huang et al.

(10) Patent No.: US 8,470,655 B1
(45) Date of Patent: Jun. 25, 2013

(54) METHOD FOR DESIGNING STRESSOR PATTERN

(75) Inventors: Chun-Hsien Huang, Tainan (TW); Ming-Jui Chen, Hsinchu (TW); Chia-Wei Huang, Kaohsiung (TW); Ting-Cheng Tseng, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/450,334

(22) Filed: Apr. 18, 2012

(51) Int. Cl.
*H01L 21/336* (2006.01)

(52) U.S. Cl.
USPC .... 438/197; 438/199; 438/301; 257/E21.409; 716/122

(58) Field of Classification Search
USPC ............ 438/14, 197, 199, 301; 257/E21.409, 257/E21.521; 716/122
See application file for complete search history.

(56) References Cited

U.S. PATENT DOCUMENTS

| 7,958,465 | B2 * | 6/2011 | Lu et al. .......................... 716/55 |
| 8,063,412 | B2 * | 11/2011 | Tsuno ............................ 257/173 |
| 8,336,011 | B2 * | 12/2012 | Topaloglu ..................... 716/110 |
| 2010/0019325 | A1 * | 1/2010 | Nakamura et al. ............. 257/369 |
| 2011/0101462 | A1 * | 5/2011 | Torii .............................. 257/368 |

OTHER PUBLICATIONS

Tsung-Min Kuo et al., U.S. Appl. No. 13/352,347, filed Jan. 18, 2012, pp. 1-22.

* cited by examiner

*Primary Examiner* — Tuan N. Quach
(74) *Attorney, Agent, or Firm* — J.C. Patents (57) ABSTRACT

A method for designing a stressor pattern is described, wherein the stressor pattern is used to form S/D regions of a second-type MOS transistor. A first distance between a boundary of the stressor pattern and a first active area of a first-type MOS transistor is derived. If the first distance is less than a safe distance, the stressor pattern is shrunk to make the first distance at least equal to the safe distance.

10 Claims, 6 Drawing Sheets

METHOD FOR DESIGNING STRESSOR PATTERN

BACKGROUND OF THE INVENTION

1. Field of Invention

This invention relates to a method for designing a semiconductor device pattern, and particularly relates to a method for designing a stressor pattern of a semiconductor device.

2. Description of Related Art

There has been a method of utilizing a SiGe stressor to form source/drain (S/D) regions of a metal-oxide-semiconductor (MOS) transistor, which utilizes the stressor to control the stress applied to the channel to raise the mobility of electrons or holes and enhance the performance of the transistor.

However, when a computer assisted logic algorithm is utilized to design SiGe patterns and the distance between the SiGe pattern of a PMOS transistor and the active area pattern of the NMOS transistor is set overly small, due to the process variation, the patterned mask layer originally intended to entirely cover the active area of the NMOS transistor cannot entirely cover the same and expose a part of the same.

Figure 1:
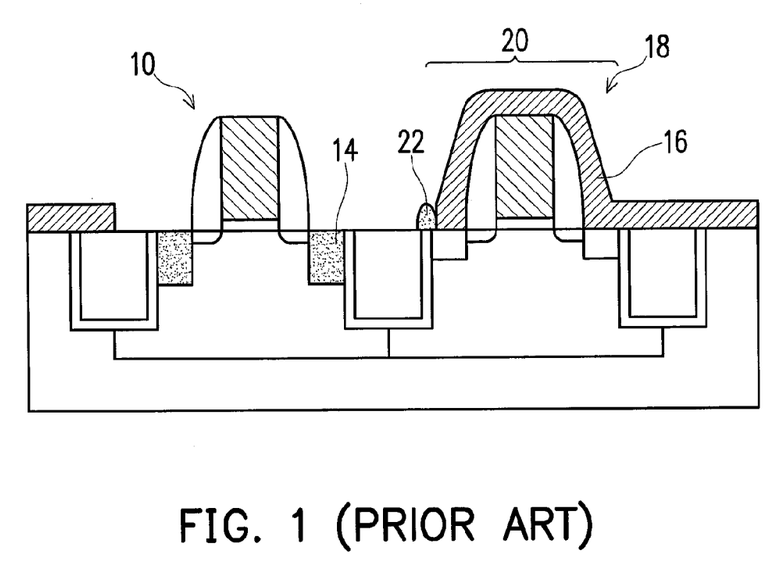
FIG. 1 illustrates a CMOS structure in the prior art.

FIG. 1 illustrates a CMOS transistor in the prior art. Referring to FIG. 1, the CMOS transistor includes a PMOS transistor 10 and a NMOS transistor 18. When the patterned mask layer 16 predetermined to entirely cover the active area 20 of the NMOS transistor 18 does not entirely cover the same, a part of the same is exposed. Hence, in the deposition for forming the SiGe layer 14, an extrusive defect 22 of SiGe grows on the part of the active area 20 of the NMOS transistor 18 exposed by the patterned mask layer 16, lowering the performance of the NMOS transistor 18. In addition, when the SiGe pattern partially overlaps with the dummy diffusion pattern, the above extrusive defect is also formed at the edge of the dummy diffusion region.

SUMMARY OF THE INVENTION

Accordingly, this invention provides a method for designing a stressor pattern, which can prevent growth of an extrusive defect at the edge of the active area.

Accordingly, this invention also provides another method for designing a stressor pattern, which can prevent growth of an extrusive defect at the edge of the dummy diffusion region.

The method for designing a stressor pattern of this invention is for forming S/D regions of a second-type MOS transistor, including the steps below. A first distance between a boundary of the stressor pattern and a first active area pattern of a first-type MOS transistor is derived. If the first distance is less than a safe distance, the stressor pattern is shrunk so that the first distance is at least equal to the safe distance.

In an embodiment of the above method, the stressor pattern and the first active area pattern are separated from each other.

In an embodiment of the above method, the safe distance is determined by the process ability of the process generation to which the method is applied.

In an embodiment of the above method, the design rule includes that a second distance between the boundary of the stressor pattern and a second active area pattern of the second-type MOS transistor is at least equal to the safe distance after the stressor pattern is shrunk. The second active area pattern may be inside of the range of the stressor pattern.

In an embodiment of the above method, the design rule includes making the width of the stressor pattern at least equal to the minimal width of the stressor pattern that can be defined by the process generation to which the method is applied.

In an embodiment, the above method further comprising: shrinking the stressor pattern when the first distance is equal to the safe distance, so that the first distance is greater than the safe distance.

Another method for designing a stressor pattern of this invention is for forming S/D regions of a MOS transistor, including the following steps. At least one dummy diffusion pattern partially overlapping with an initial stressor pattern is identified. At least one assist stressor pattern covering the at least one dummy diffusion pattern is derived. The initial stressor pattern and the at least one assist stressor pattern are combined o obtain the target stressor pattern.

In an embodiment, there are a plurality of dummy diffusion patterns partially overlapping with the initial stressor pattern and a plurality of assist stressor patterns are derived covering the plurality of dummy diffusion patterns, and the above method further comprising merging neighboring assist stressor patterns among the plurality of assist stressor patterns. The neighboring assist stressor patterns may be merged after the initial stressor pattern and the assistant stress layers are combined.

In the method for designing a stressor pattern of this invention, because the first distance between the boundary of the stressor pattern and the first active area pattern of the first-type MOS transistor is at least equal to the safe distance, the process window is greater preventing growth of an extrusive defect at the edge of the active area pattern of the first-type MOS transistor.

Moreover, in the method for designing a stressor pattern of this invention, since the stressor pattern entirely covers the dummy diffusion pattern, growth of an extrusive defect at the edge of the dummy diffusion region can be prevented.

In order to make the aforementioned and other objects, features and advantages of the present invention comprehensible, a preferred embodiment accompanied with figures is described in detail below.

DESCRIPTION OF EMBODIMENTS

Figure 2A:
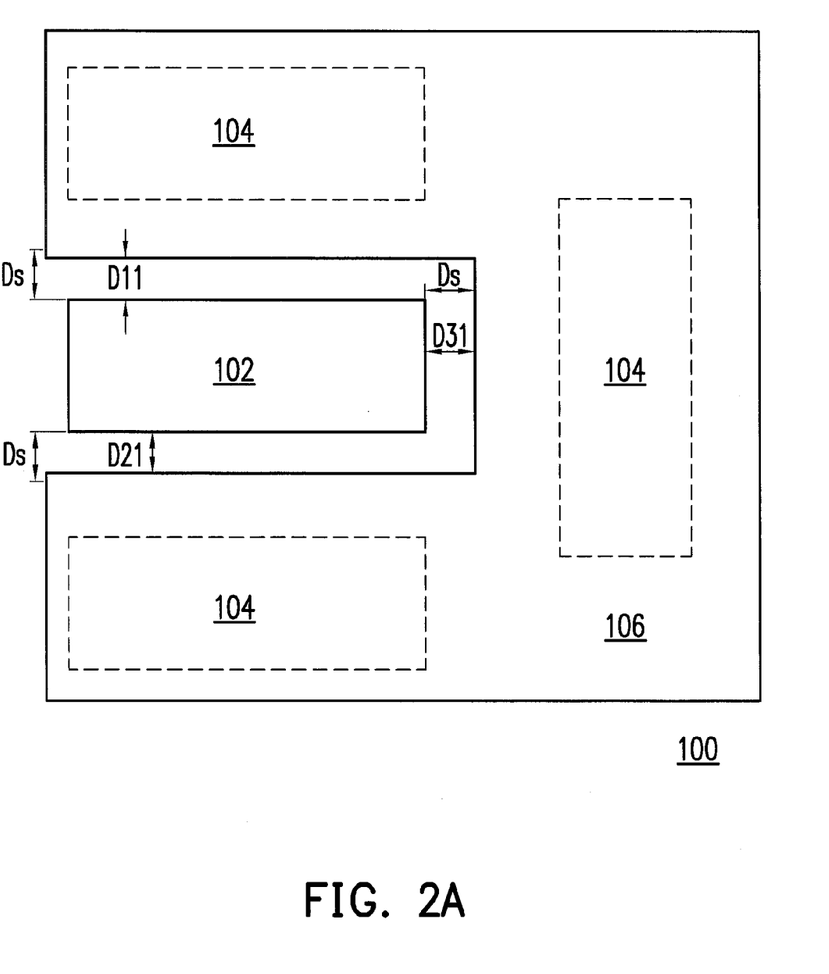
FIGS. 2A and 2B schematically illustrate a process of designing a stressor pattern according to an embodiment of this invention.
Figure 2B:
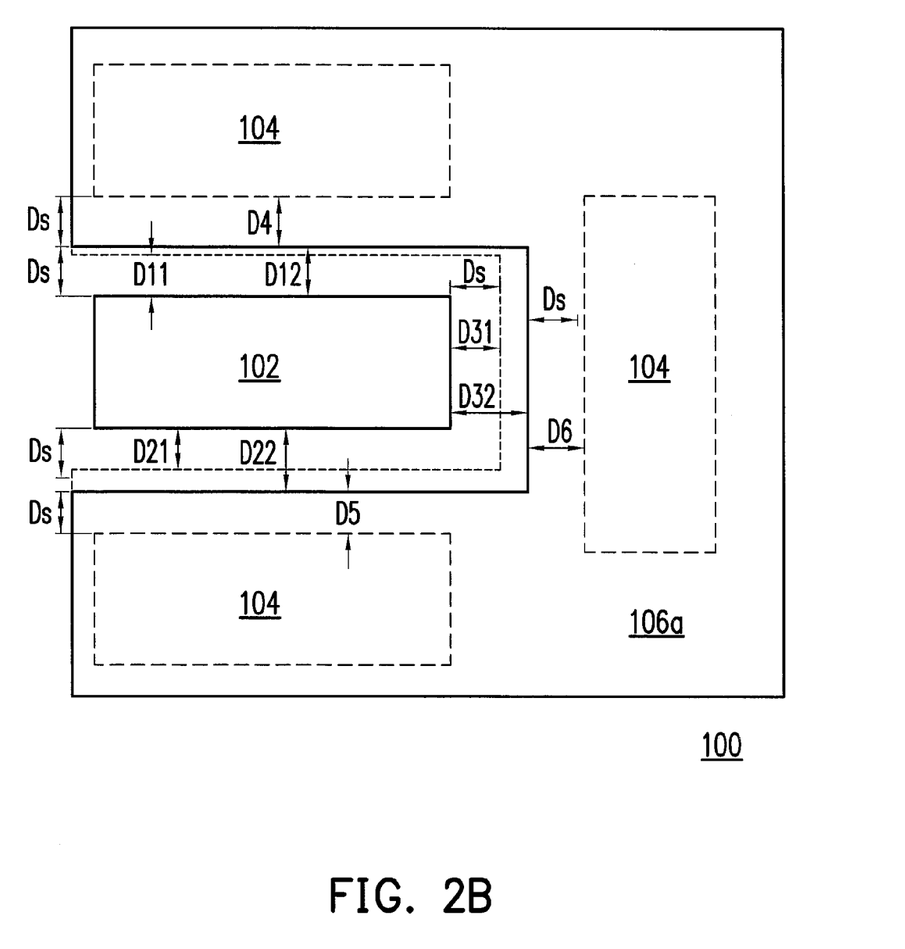

FIGS. 2A and 2B schematically illustrate a process of designing a stressor pattern according to an embodiment of this invention.

Referring to FIG. 2A, the semiconductor device pattern 100 includes a first active area pattern 102 of a first-type MOS transistor, second active area patterns 104 of second-type MOS transistors, and a stressor pattern 106 for forming the S/D regions of the second-type MOS transistors to control the stress applied to the channels. The stressor pattern 106 may be separated from the first active area pattern 102, as shown in the figure. The second active area pattern 104 may be disposed inside of the range of the stressor pattern 106.

When the first-type MOS transistor is a NMOS transistor and the second-type MOS transistors are PMOS transistors, the material of the stressor defined by the stressor pattern 106 may be SiGe. When the first-type MOS transistor is a PMOS transistor and the second-type MOS transistors are NMOS transistors, the material of the stressor defined by the stressor pattern 106 may be SiC.

In the method for designing a stressor pattern of this embodiment, first distances D11, D21 and D31 between the boundary of the stressor pattern 106 and the active area pattern 102 of the first-type MOS transistor are derived first. The first distances D11 and D21 are less than a safe distance Ds and the first distance D31 equal to Ds. The safe distance Ds may be determined by the process ability of the process generation to which the designing method is applied.

Referring to 2B where the dash line indicates the boundary of the initial stressor pattern 106 and the solid line indicates that of the adjusted stressor pattern 106a, because the first distances D11 and D21 are less than the safe distance Ds, the stressor pattern 106 is shrunk at the corresponding positions to form a smaller stressor pattern 106a, so that the first distances D11 and D21 are increased to D12 and D22, respectively, that are at least equal to the safe distance Ds. It is possible that the first distance D12 is equal to Ds and the first distance D22 greater than Ds.

Because the first distances D12 and D22 between the boundary of the stressor pattern 106a and the first active area pattern 102 of the first-type MOS transistor are at least equal to the safe distance Ds, the process window is greater so that possible process variation in lithography or etching, etc., can be tolerated. For example, when the first distances D12 and D22 between the boundary of the stressor pattern 106a and the active area pattern 102 of the first-type MOS transistor are at least equal to the safe distance Ds, the patterned mask layer on the active area pattern 102 can still entirely cover the same even if having been shrunk due to the process variation. As a result, an extrusive defect is not formed at the edge of the first active area 102 in the subsequent deposition process for forming the stressor.

Moreover, though the first distance D31 is initially equal to the safe distance Ds, the portion of the stressor pattern 106 may be optionally shrunk into the corresponding portion of the smaller stressor pattern 106a, so that the first distance D31 is increased to D32 greater than the safe distance Ds and the process window therearound is further improved.

In addition, in the step of shrinking the stressor pattern 106 into the smaller stressor pattern 106a, the design rule may include that the second distances D4, D5 and D6 between the boundary of the stressor pattern 106a and the second active area pattern 104 of the second-type MOS transistor are at least equal to the safe distance Ds after the shrinkage. It is possible that the second distances D4 and D5 are equal to Ds and the second distance D6 greater than Ds. Moreover, the design rule of the stressor pattern 106a may also include making the width of the stressor pattern 106a at least equal to the minimal stressor width that can be defined by the process generation to which the designing method is applied, so as to prevent a necking issue of the stressor.

According to the above embodiment, because the first distances D12, D22 and D32 between the boundary of the adjusted stressor pattern 106a and the first active area pattern 102 of the first-type MOS transistor are at least equal to the safe distance Ds, the process window is greater. As a result, even if process variation occurs, an extrusive defect is not formed at the edge of the active area 102 of the first-type MOS transistor, so that the electrical performance of the semiconductor device is improved.

Figure 3:
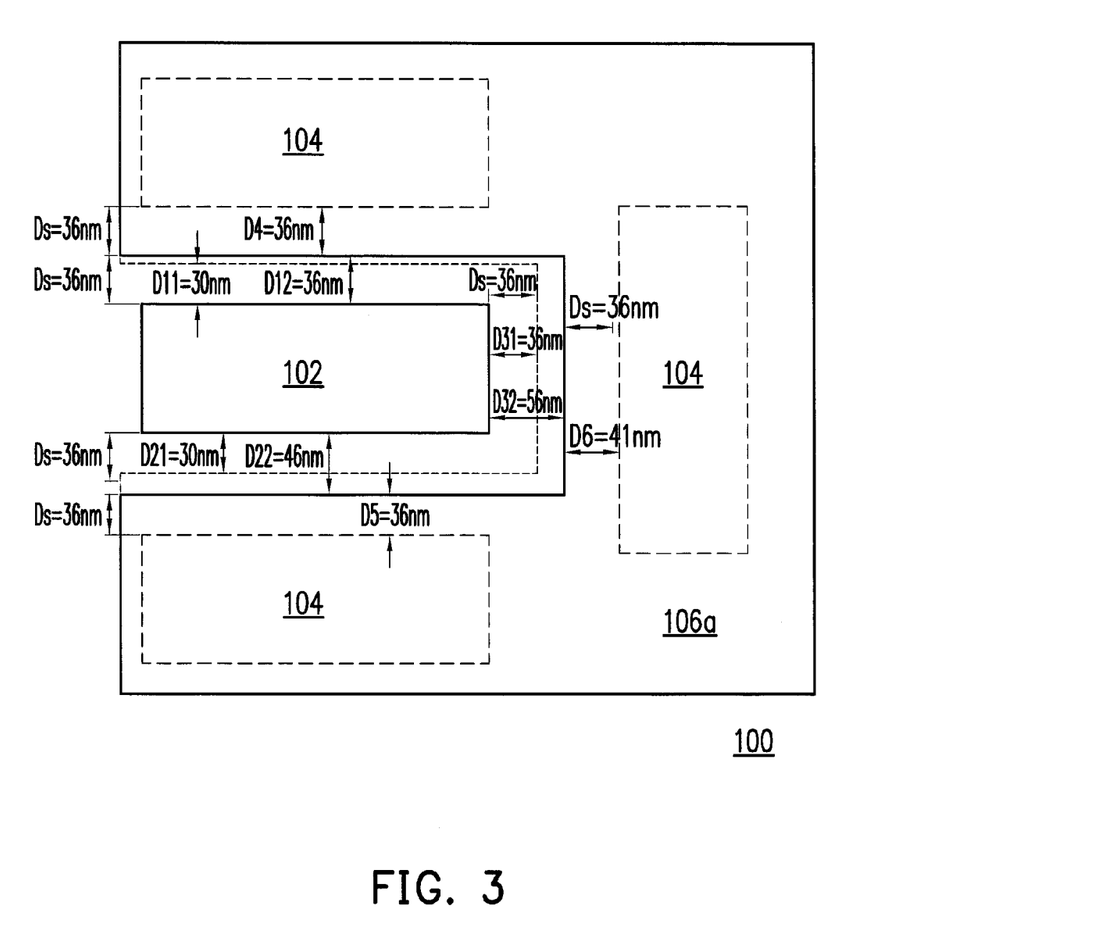
FIG. 3 schematically illustrates application of the embodiment shown in FIG. 1B to a 40 nm semiconductor process.

FIG. 3 schematically illustrates application of the embodiment shown in FIG. 2B to a 40 nm semiconductor process, wherein the parts with the same reference characters as in FIG. 2B have the same arrangements, uses and effects and are not described again.

In the embodiment shown in FIG. 3, it is possible that the first active area 102 is the active area of a NMOS transistor, the second active area 104 is the active area of a PMOS transistor, the stressor pattern 106a is utilized to form a stressor including SiGe that serve as the S/D regions of the PMOS transistor. In the figure, the dash line indicates the boundary of the initial stressor pattern 106, and the solid line indicates that of the adjusted stressor pattern 106a.

Referring to FIGS. 3, 2A and 2B, in an example, the first distances D11 and D21 are calculated as 30 nm and the first distance D31 as 36 nm. The safe distance Ds is set to 36 nm in the example, so that the first distances D11 and D21 are less than Ds and the first distance D31 equal to D11. The stressor pattern 106 is shrunk into the smaller stressor pattern 106a such that the first distances D11 and D21 are increased to D12 and D22, respectively, that are at least equal to the safe distance Ds. The first distance D12 is 36 nm equal to the safe distance Ds, while the first distance D22 is 46 nm greater than the safe distance Ds. Moreover, though the first distance D31 is originally equal to the safe distance Ds, it may still be optionally increased to D32 (56 nm) greater than Ds to further improve the process window therearound.

In the step of shrinking the stressor pattern 106 into the smaller stressor pattern 106a, the design rule may include setting the second distances D4, D5 and D6 between the boundary of the stressor pattern 106a and the second active area pattern 104 to 36 nm, 36 nm and 41 nm, respectively, wherein the adjusted D4 and D5 are equal to the safe distance Ds and the adjusted D6 greater than Ds. Nevertheless, the adjusted second distances D4 and D5 may alternatively be greater than the safe distance Ds, and the adjusted second distance D6 may alternatively be equal to Ds. In addition, the design rule may also include making the width of the stressor pattern 106a at least equal to 162 nm so that the width of the stressor pattern 106a is at least equal to the minimal stressor width that can be defined by a 40 nm semiconductor process.

Referring to FIG. 3 again, in the process of forming the trench for forming the stressor by utilizing the semiconductor device pattern 100 shown in FIG. 3, the stressor pattern 106 or 106a corresponds to the range of the trench for forming the stressor, and the region not covered by the stressor pattern 106 or 106a corresponds to the range of the patterned mask layer covering the first active area 102.

The ranges of the patterned mask layer covering the first active area 102 before and after the adjustment to the stressor pattern are listed in Table 1 below.

TABLE 1

| Position | D11/D12 | D21/D22 | D31/D32 |
|---|---|---|---|
| Before the adjustment | 30 | 30 | 36 |
| After the adjustment | 36 | 46 | 56 |
| Increased values due to the adjustment | 6 | 16 | 20 |
| Additional process window relative to Ds (36 nm) | 0 | 10 | 20 |

(unit: nm)

According to Table 1, under the design rule that the safe distance Ds is set to be 36 nm and the second distance D4 set to be 36 nm, around the position where the first distance D11 (30 nm) is adjusted to D12 (36 nm), the patterned mask layer covering the first active area 102 is expanded by 6 nm at most, and the additional process window relative to the safe distance Ds (36 nm) is zero.

Under the design rule that the safe distance Ds is set to be 36 nm and the second distance D5 set to be 36 nm, around the position where the first distance D21 (30 nm) is adjusted to D22 (46 nm), the patterned mask layer covering the first active area 102 is expanded by 16 nm at most, and the additional process window relative to the safe distance Ds (36 nm) is 10 nm.

Under the design rule that the safe distance Ds is set to be 36 nm and the second distance D6 set to be 41 nm, around the position where the first distance D31 (36 nm) is adjusted to D32 (56 nm), the patterned mask layer covering the first active area 102 is expanded by 20 nm at most, and the additional process window relative to the safe distance Ds (36 nm) is 20 nm.

Similarly, in the above embodiment, because the first distances D12, D22 and D32 between the boundary of the adjusted stressor pattern 106a and the first active area pattern 102 of the NMOS transistor are at least equal to the safe distance Ds, the process window is greater. As a result, even if process variation occurs, an extrusive defect is not formed at the edge of the active area 102, so that the electrical performance of the semiconductor device is improved effectively.

FIGS. 4A-4D schematically illustrate a process of designing a stressor pattern according to another embodiment of this invention.

Figure 4A:
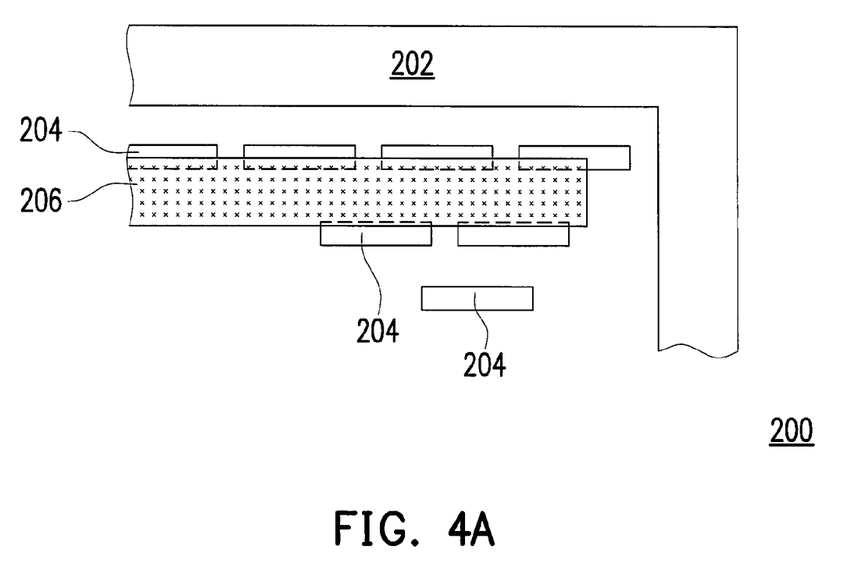
FIGS. 4A-4D schematically illustrate a process of designing a stressor pattern according to another embodiment of this invention.

Referring to FIG. 4A, the semiconductor device pattern 200 includes a device pattern 202 of a MOS transistor, a plurality of dummy diffusion patterns 204 and an initial stressor pattern 206. The MOS transistor may be a NMOS transistor or a PMOS transistor. The device pattern 202 may be a word line pattern. The dummy diffusion patterns 204 serve to balance the pattern density.

At first, among all the dummy diffusion patterns 204, those partially overlapping with the initial stressor pattern 206 are identified. It is noted that though there are six dummy diffusion patterns 204 partially overlapping with the initial stressor pattern 206 in the figure, this invention is not limited thereto. This invention is applicable if only there is at least one dummy diffusion pattern 204 partially overlapping with the initial stressor pattern 206.

Figure 4B:
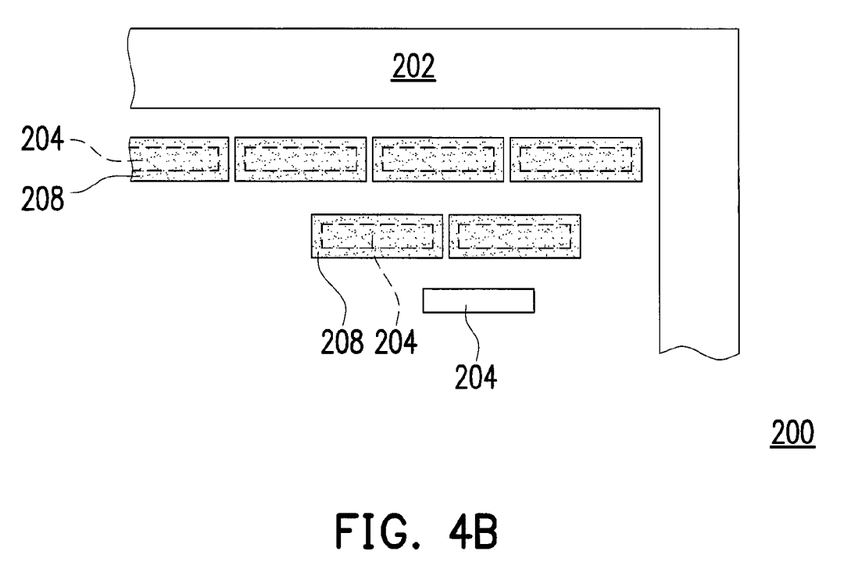

Referring to FIG. 4B, a plurality of assist stressor patterns 208 entirely covering the overlapping dummy diffusion patterns 204 are then derived to solve the issue that the initial stressor pattern 206 partially overlaps with the dummy diffusion patterns 204.

Figure 4C:
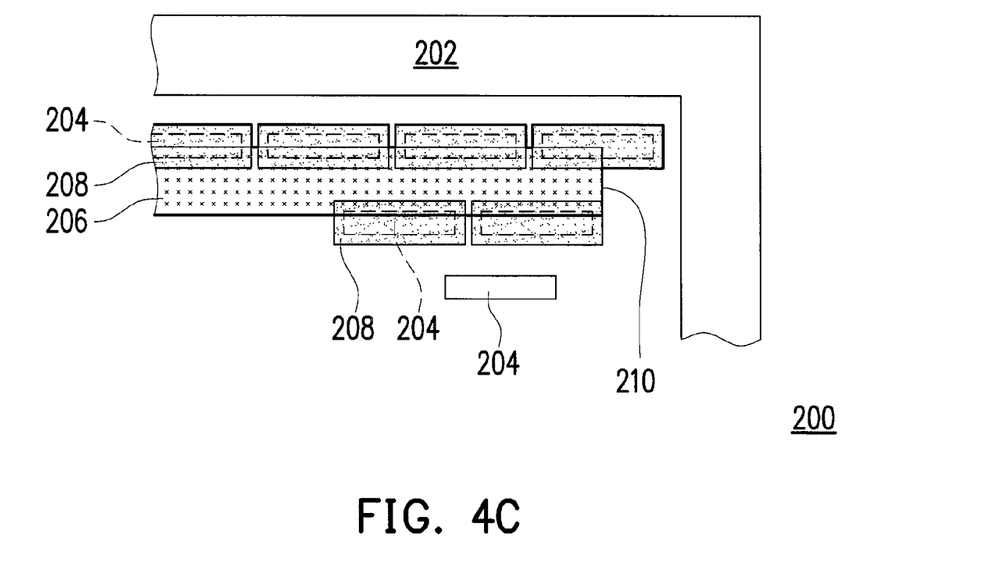

Referring to FIG. 4C, the initial stressor pattern 206 and the assist stressor patterns 208 are combined to obtain a stressor pattern 210 that entirely covers the overlapping dummy diffusion patterns 204. The stressor pattern 210 can be utilized to form the S/D regions of the MOS transistor to control the stress applied to the channel.

Figure 4D:
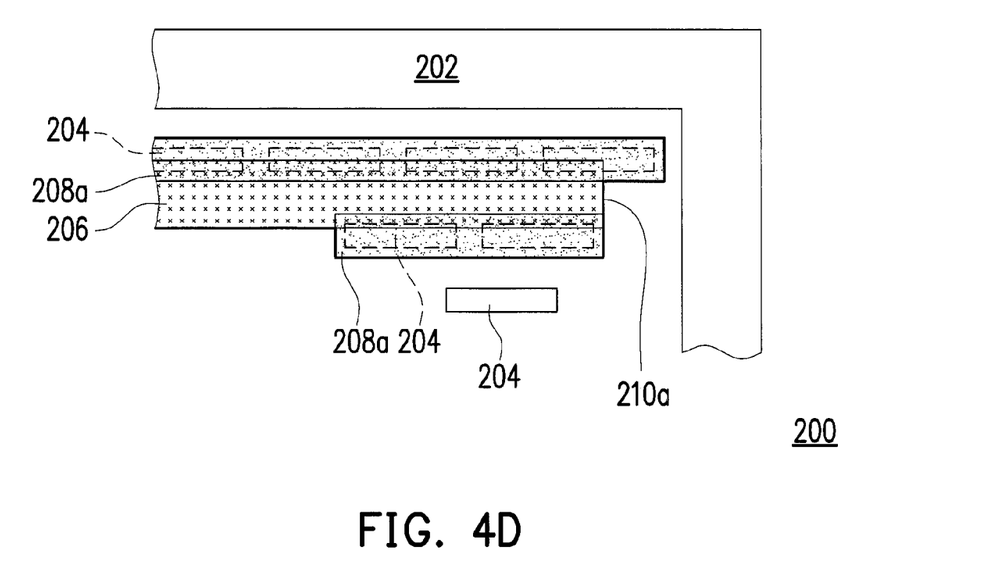

Referring to FIG. 4D, when there are a plurality of dummy diffusion patterns 204 partially overlapping with the initial stressor pattern 106 and a plurality of assist stressor patterns 208 are derived covering the plurality of dummy diffusion patterns 204, it is possible to optionally further merge neighboring assist stressor patterns 208 among the plurality of assist stressor patterns 208 and form an assist stressor pattern 208a, so that a stressor pattern 210a is formed finally. Thereby, in the process of forming the trench for forming the stressor, there is no narrow and easily collapsing portion of the patterned mask layer between the neighboring assist stressor patterns 208.

In the above embodiment, because the dummy diffusion patterns 204 are utilized to form dummy diffusion patterns regions that do not affect the electrical properties, the stressor pattern 210 or 210a is designed entirely covering the overlapping dummy diffusion patterns 204. Thereby, the overlapping dummy diffusion patterns 204 can be removed in the process of forming the trench for forming the stressor, and no extrusive defect is formed at the edges of the dummy diffusion regions. Hence, the electrical performance of the semiconductor device can be improved effectively.

Accordingly, by utilizing the methods for designing a stressor pattern of the above embodiments, no extrusive defect is formed at the edge(s) of the active area or the dummy diffusion region(s), and the electrical performance of the semiconductor device can be improved effectively.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of designing a stressor pattern for forming source/drain (S/D) regions of a second-type metal-oxide-semiconductor (MOS) transistor, comprising:
    deriving a first distance between a boundary of the stressor pattern and a first active area pattern of a first-type MOS transistor; and
    shrinking the stressor pattern if the first distance is less than a safe distance, so that the first distance is at least equal to the safe distance.

2. The method of claim 1, wherein the stressor pattern and the first active area pattern are separated from each other.

3. The method of claim 1, wherein the safe distance is determined by a process ability of a process generation to which the method is applied.

4. The method of claim 1, a design rule thereof including that a second distance between the boundary of the stressor pattern and a second active area pattern of the second-type MOS transistor is at least equal to the safe distance after the stressor pattern is shrunk.

5. The method of claim 4, wherein the second active area pattern is inside of a range of the stressor pattern.

6. The method of claim 1, a design rule thereof including: making a width of the stressor pattern at least equal to a minimal width of the stressor pattern that can be defined by a process generation to which the method is applied.

7. The method of claim 1, further comprising: shrinking the stressor pattern when the first distance is equal to the safe distance, so that the first distance is greater than the safe distance.

8. A method of designing a stressor pattern for forming S/D regions of a MOS transistor, comprising:
    identifying at least one dummy diffusion pattern partially overlapping with an initial stressor pattern;
    deriving at least one assist stressor pattern covering the at least one dummy diffusion pattern; and
    combining the initial stressor pattern and the at least one assist stressor pattern to obtain the stressor pattern.

9. The method of claim 8, wherein there is a plurality of dummy diffusion patterns partially overlapping with the initial stressor pattern, and a plurality of assist stressor patterns are derived covering the plurality of dummy diffusion patterns, the method further comprising: merging neighboring assist stressor patterns among the plurality of assist stressor patterns.

10. The method of claim 9, wherein the neighboring assist stressor patterns are merged after the initial stressor pattern and the assist stressor patterns are combined.

* * * * *